United States Patent
French et al.

(10) Patent No.: US 8,537,941 B1
(45) Date of Patent: Sep. 17, 2013

(54) BIT-SYNCHRONOUS FEEDBACK CONTROL OF RECEIVER SENSITIVITY

(75) Inventors: John Sargent French, Palm, PA (US); Ernest Eisenhardt Bergmann, Borough of Fountain Hill, PA (US)

(73) Assignee: Receivers Unlimited LLC, Palm, PA (US)

( * ) Notice: Subject to any disclaimer, the term of this patent is extended or adjusted under 35 U.S.C. 154(b) by 211 days.

(21) Appl. No.: 13/167,312

(22) Filed: Jun. 23, 2011

Related U.S. Application Data

(60) Provisional application No. 61/361,692, filed on Jul. 6, 2010.

(51) Int. Cl.
*H04L 27/08* (2006.01)

(52) U.S. Cl.
USPC ........... 375/345; 375/136; 375/147; 375/316; 375/354

(58) Field of Classification Search
USPC ......... 375/345, 136, 147, 316, 354; 330/129, 330/254; 455/234.1
See application file for complete search history.

(56) References Cited

U.S. PATENT DOCUMENTS

| | | | | |
|---|---|---|---|---|
| 5,010,292 A | * | 4/1991 | Lyle, Jr. | 323/274 |
| 5,602,510 A | | 2/1997 | Bayruns et al. | |
| 6,819,155 B1 | * | 11/2004 | Ling et al. | 327/175 |
| 7,447,490 B2 | | 11/2008 | Kuo et al. | |
| 2006/0268969 A1 | * | 11/2006 | Kimura et al. | 375/225 |
| 2009/0245807 A1 | * | 10/2009 | Nomura | 398/135 |

* cited by examiner

*Primary Examiner* — Dhaval Patel
(74) *Attorney, Agent, or Firm* — Wendy W. Koba

(57) ABSTRACT

A receiver including an amplifying section for converting a relatively low power digital input signal into a relatively high power digital output signal is configured to utilize an adjustable feedback signal that is synchronous with the bit rate of the incoming digital signal so as to modify the level of the feedback signal as a function of time along the width of each bit of the digital input signal, increasing the bandwidth of the receiver at the leading edge of each incoming bit and decreasing the bandwidth otherwise.

15 Claims, 7 Drawing Sheets

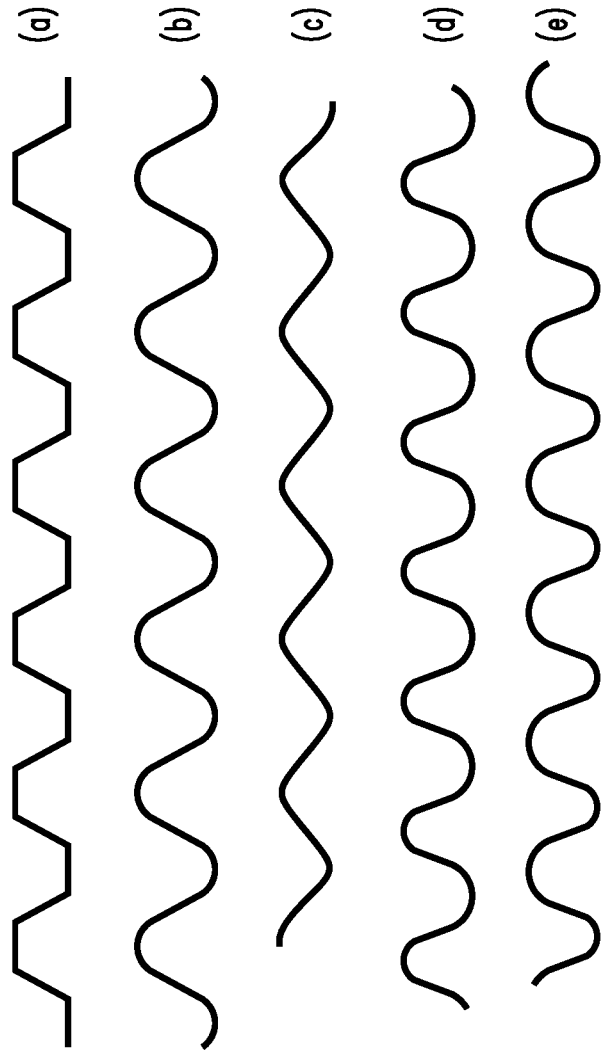

BIT-SYNCHRONOUS FEEDBACK CONTROL OF RECEIVER SENSITIVITY

CROSS-REFERENCE TO RELATED APPLICATIONS

This application claims the benefit of U.S. Provisional Application No. 61/361,692, filed Jul. 6, 2010 and herein incorporated by reference.

TECHNICAL FIELD

The present invention relates to receivers used in digital systems and, more particularly, to an arrangement for providing bit-synchronous modulation of feedback within the receiver in order to improve the sensitivity of the receiver.

BACKGROUND OF THE INVENTION

Digital data is stored and transferred for many applications. Communications is becoming more and more digital. For example, telephony, which was originally analog throughout the world is now almost totally digital. Also, musical performances are now digitally recorded and distributed on CDs. Visual material that had previously been distributed via film and/or VHS tape is now contained on DVDs and Blue Ray disks; television broadcasting has now also entered the digital domain.

Analog "front ends" for digital receivers are thus needed to support the various digital technologies. When a CD, DVD or hard drive is accessed, a receiver is needed to boost the relatively weak signal into a stronger representation that may be properly interpreted in the digital domain. In some cases (such as, for example, with a CD or DVD), a laser is focused on a moving track that causes the light that reaches the receiver to vary as a function of time. The receiver includes a type of opto-electronic conversion device (usually, a photodiode) that converts the received optical signal into a relatively weak electrical signal. One task of the receiver is to amplify this weak signal to a level sufficient to discriminate between the transmission of digital "one's" and digital "zero's".

Receivers are also a necessary component of communication systems. For example, in a digital fiber-optic link, an optical signal is conveyed over considerable distances by an optical fiber. In some configurations, an optical receiver converts this relatively weak optical signal into a (weak) electrical signal via, for example, a photodiode; electrical amplification is then used to increase the level of the electrical signal to a point where it can be reliably converted into a digital stream of one's and zero's.

All of the above examples require digital, baseband receiver circuits to convert a weak electrical signal into a more robust form that can be readily converted into a digital stream of one's and zero's. A baseband receiver, in contrast to a tuned broadcast receiver, operates with signals where the important frequency range extends from nearly DC (zero frequency) to a level comparable with the bit rate used for transmission.

For a given type of input signal (i.e., optical or electrical) and data encoding method, the main figure of merit for a receiver is its sensitivity. Receiver sensitivity in the digital domain is related to the Bit Error Rate (BER) of the system. When a weak digital signal is received, an occasional bit may be incorrectly labeled (namely, defined as a digital "one" when a digital "zero" was originally transmitted, or vice versa). The ratio of mis-labeled bits to the total number of bits received is thus defined as the BER. For example, in the Ethernet Standards (IEEE 802.3), the minimum level of performance is specified as a BER of $10^{-12}$. Modern digital data systems now require a BER on the order of $10^{-6}$ to $10^{-12}$, depending upon the application. Stated differently, the receiver sensitivity is the minimum signal power needed to achieve the specified BER. If the receiver is presented with a signal below its sensitivity limits, it will have a much higher BER, since random fluctuations (generally attributed to "noise sources" in the receiver) will cause the apparent signal to be mis-interpreted upon occasion.

Receiver sensitivity is important inasmuch as greater sensitivity may indicate that a specific receiver will operate under a greater number of adverse conditions (e.g., poor media—in the case of digital data recordings; greater distances—in the case of transmission systems). For example, in the case of optical fiber transmission systems, a 2 dB improvement in receiver sensitivity may lead to an increase of 5-10 km in the transmission distance signal range.

Optimizing receiver sensitivity is not trivial, and receiver circuits are often designed as a compromise between competing elements, such as noise versus bandwidth. A need therefore remains for a receiver configuration that is not constrained by the competing interests of maintaining a low noise level and a relatively wide operating bandwidth.

SUMMARY OF THE INVENTION

The needs remaining in the prior art are addressed by the present invention, which relates to a receiver arrangement and, more particularly, to a receiver with increased sensitivity realized by improving the noise performance of the receiver without excessive spreading of the received bits into the neighboring bits (as might be caused, for example, by just reducing the bandwidth).

In accordance with the present invention, a receiver is configured to modulate the parameters of the circuit in synchronization with the incoming data signal so as to adjust its sensitivity in a real-time fashion. In particular, a dynamic feedback arrangement is utilized that functions to increase the receiver's bandwidth at the leading edge of each data bit, thus improving its high speed response. The dynamic feedback arrangement will also decrease the receiver's bandwidth in the middle of each bit, reducing the noise level present in the signal. By dynamically adjusting the receiver's bandwidth as a function of location along the "width" of the received bit, the sensitivity of the receiver is significantly increased. A further improvement in operation may be obtained by optimizing the shape of the change in bandwidth curve as a function of time.

In accordance with one embodiment of the present invention, a variable feedback resistance element is used to dynamically adjust the bandwidth. A field-effect transistor (FET) may be utilized for this purpose, with a control signal synchronized with the incoming bit rate utilized to match the changing resistance in the feedback path with the location along the width of an incoming bit. Various shunt and series resistance elements may be used in conjunction with the FET to limit the excursions in the feedback resistance value.

It is the intent of the present invention to use time variations of circuit elements within the amplifier to approach the theoretically-optimum filter shape that is known to optimize the sensitivity of the receiver. Additionally, overload of the circuit itself is addressed by gradually reducing the amount of feedback as the signal strength improved, thus increasing the receiver's dynamic range.

Other and further features and embodiments of the present invention will become apparent during the course of the following discussion and by reference to the accompanying drawings.

BRIEF DESCRIPTION OF THE DRAWINGS

Referring now to the drawings, where like numerals represent like elements in different embodiments.

FIG. 5 illustrates various types of waveforms that may be used as the bit-synchronous control signal input C(t) to the variable feedback resistance element in the arrangement of the present invention;

DETAILED DESCRIPTION

As is known in the art, improving receiver sensitivity is related to maximizing the signal-to-noise ratio (SNR) for the weak signals presented to the receiver. An important aspect to maximizing the SNR is to minimize noise sources at locations where the data signal is weakest, for example, at the input to the receiver gain stage.

Figure 1:
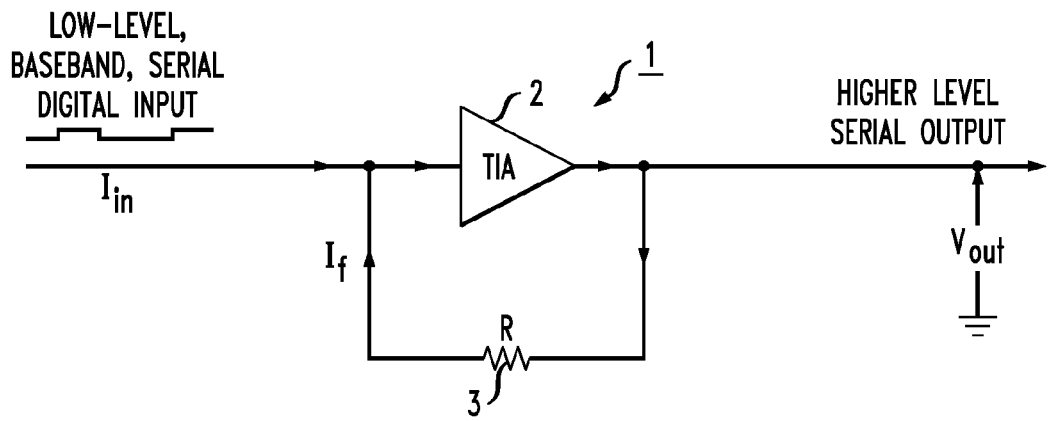
FIG. 1 illustrates an exemplary prior art transimpedance amplifier (TIA) receiver gain stage.

FIG. 1 illustrates an exemplary prior art receiver gain stage 1 in the form of a transimpedance amplifier (TIA) 2 and a resistive feedback element 3. Feedback element 3 provides a feedback current $I_f$ in response to the output voltage $V_{out}$ from TIA 2. Assuming that the gain of TIA 2 is very large, the effect of this feedback is that output voltage $V_{out}$ is defined as follows:

$$V_{out} = I_{in} * R,$$

where R is the resistance value associated with element 3 and $I_{in}$ is defined as the input current applied to TIA 2.

It is to be understood that the signs of $I_{in}$ and $V_{out}$ are selected to be of opposite polarity; that is, if $I_{in}$ is flowing away from TIA 2, voltage $V_{out}$ will be positive (with respect to ground). In this, the feedback provided by resistive element 3 is "negative" and if the value of R is small enough, the associated gain vs. frequency curve will be very flat and extend to very high frequencies. In actual implementation, the gain falls off since at higher frequencies the intrinsic gain of the amplifier falls to a point that even without negative feedback, the transimpedance is insufficient to satisfy the above relationship.

It follows that for a given value of $I_{in}$, making the value of R large will increase the output voltage $V_{out}$. However, output voltage $V_{out}$ cannot be increased indefinitely, since the intrinsic gain of TIA 2 is finite and the output voltage can never exceed the supply voltage. Additionally, the bandwidth of the circuit will diminish for large values of R as a result of the gain-bandwidth limitations of TIA 2 (as well as the parasitic circuit capacitances between the input and ground, or between the input and output (i.e., across resistive element 3).

As alluded to earlier, the SNR is a critical issue. When the value of resistive element 3 is increased, the feedback signal is decreased. The noise that is generated by TIA 2 is also likely to decrease and thus improve the SNR.

Noise may be introduced by the presence of resistive element 3 itself, an effect known as "Johnson-Nyquist" noise (or, variously, "thermal noise", "Johnson noise" or "Nyquist noise") and is attributed to Brownian (thermal) motion of the charge carriers. Specifically, this type of noise can be defined as follows:

$$v^2 = 4 * k_b * T * R,$$

where $k_b$ is Boltzmann's constant, T is the temperature of resistive element 3 (measured in Kelvin), R is the resistance value of element 3 measure in ohms and $v^2$ is mean square noise per unit bandwidth measured in Hz. Inasmuch as the SNR improves with increasing R, the effective bandwidth is decreasing until eventually the bandwidth is no longer sufficient to pass the signal. At this point the SNR ratio no longer improves with increasing R, but reaches a peak and begins to decline with increasing R.

Figure 2:
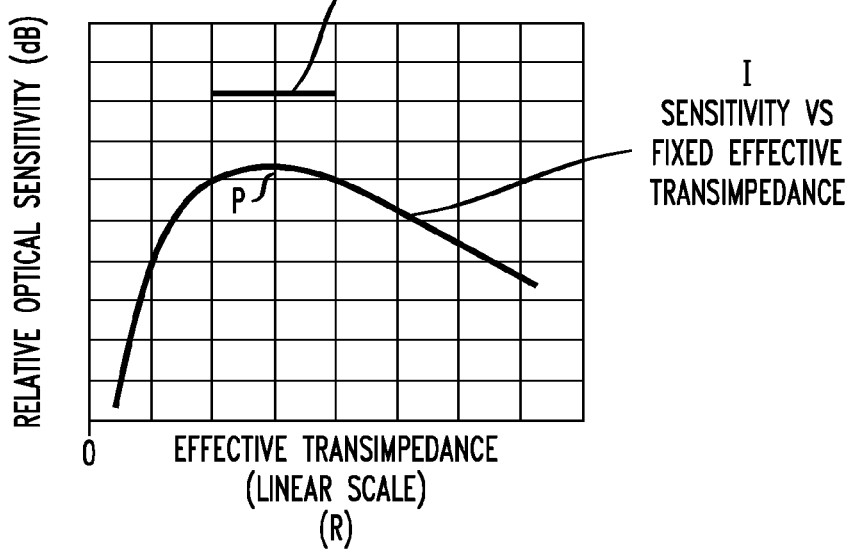
FIG. 2 contains a plot of sensitivity as a function of effective transimpedance for a both a conventional receiver (graph I) and a variable feedback receiver of the present invention (graph II)

FIG. 2 contains an experimental plot of optical sensitivity as a function of effective transimpedance R, showing how the (non-time-varying) receiver sensitivity varies for selected values of R. At relatively small values of transimpedance (left-hand portion of curve I), the sensitivity is poor since the signal is weak compared to other noise sources in the receiver. As the transimpedance is increased (moving from left to right along the curve), the sensitivity increases to a point P, defined as the optimum sensitivity point.

As shown, further increases in R become detrimental; the noise is reduced but the signal becomes badly affected by the continuing reduction in bandwidth. The reduction in bandwidth in turn causes the signal energy during a particular bit period to "spread" increasingly into the neighboring bit periods. This spreading not only reduces the magnitude of the bit during its time interval, but introduces its energy into other bit times, resulting in inter-symbol interference (ISI). ISI results in requiring a larger input signal to overcome the noise, thus once again degrading the receiver sensitivity. In extreme cases, ISI can produce data errors even in the absence of noise.

In light of this analysis, the conventional wisdom has been that the best sensitivity to be expected from a receiver is that given by point P on curve I—the 'best sensitivity' point. However, as will be discussed in detail below, further improvements in receiver sensitivity are obtained in accordance with the present invention by dynamically adjusting the feedback of the TIA during the bit period.

Figure 3:
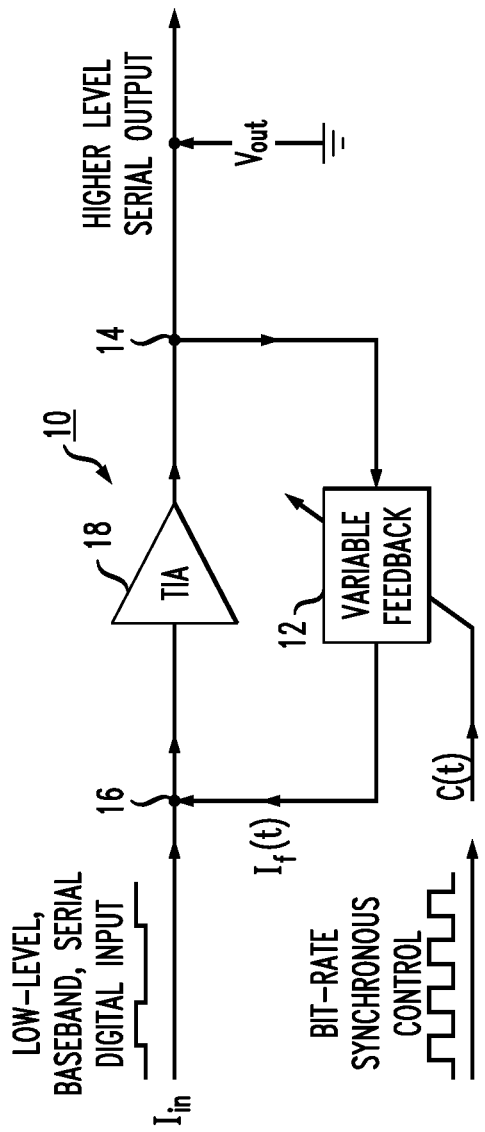
FIG. 3 illustrates an exemplary amplifying section 10 of a receiver formed in accordance with the present invention.

Indeed, FIG. 3 illustrates an exemplary amplifying section 10 of a receiver, formed in accordance with the present invention, that utilizes a variable feedback resistance element 12 between the output node 14 and input node 16 of a transimpedance amplifier (TIA) 18 to provide a variable feedback current $I_f(t)$ at input node 16. As shown in FIG. 3, variable feedback resistance element 12 is controlled by an incoming control signal C(t) in a manner such that the value of the resistance is synchronous with (and changes as a function of) the bit rate of the incoming signal $I_{in}$. As will be discussed in detail below, there are many suitable circuit arrangements that are capable of providing the dynamic resistive value as a function of bit rate. In this case, the sensitivity of the dynamic system is improved by about 2 dB over the static TIA, shown by the plot II in the graph of FIG. 2.

Various exemplary arrangements for variable feedback resistance element 12 are illustrated in the diagram of amplifying section 10 as shown in FIGS. 4(a)-(d). In each of these embodiments, a field effect transistor (FET) 20 is used as the basic component in variable feedback resistance element 12. An FET device is a very attractive way to provide an approximately resistive value that can be rapidly varied and, therefore, is considered as a preferred embodiment of the present invention.

FIG. 4 (a) illustrates the simplest embodiment of element 12, with an FET 20 utilized to provide the variable resistance and, as a result, a variable feedback signal $I_f(t)$. As shown, a gate electrode 22 of FET 20 is used to receive a bit-rate synchronous control signal C(t), with a drain electrode 24 of FET 20 coupled to output node 14 and a source electrode 26 coupled to input node 16 of TIA 18. Depending upon the voltage applied between gate electrode 22 and gate electrode 26, FET 20 will exhibit an effective resistance that varies from a relatively few ohms (when in "saturation" mode) to extremely high values (when in "cutoff" mode). Thus, depending upon where FET 20 is between these two extreme modes, the effective resistance and feedback control signal $I_f(t)$ can be varied in a somewhat controllable manner.

Figure 4A:
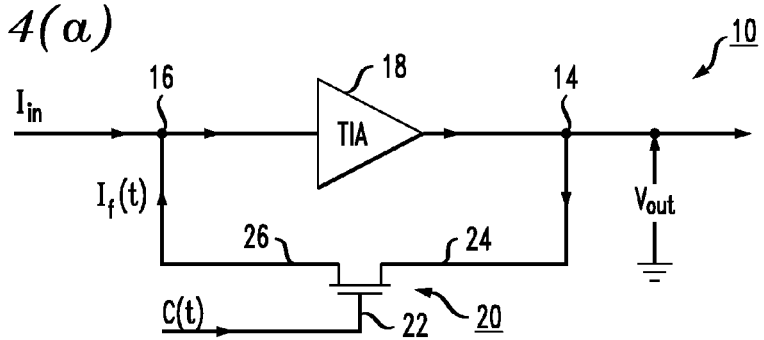
FIGS. 4(a)-4(d) show a set of four different variable resistive feedback arrangements that may be used in the arrangement of FIG. 3.
Figure 4B:
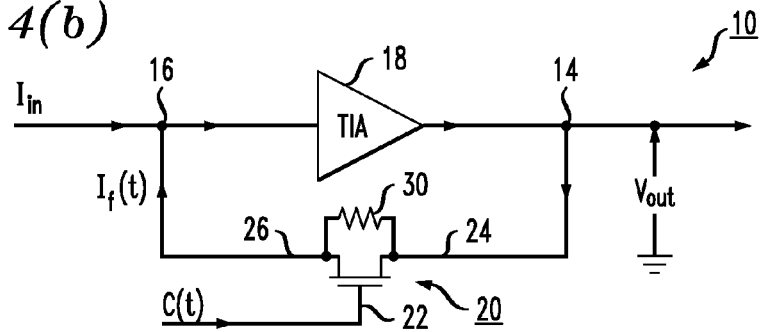
Figure 4C:
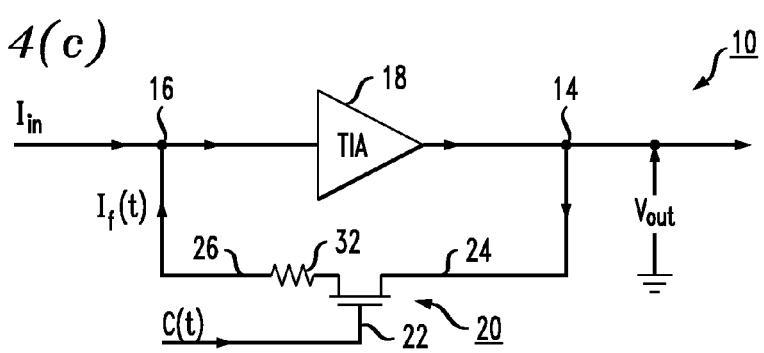
Figure 4D:
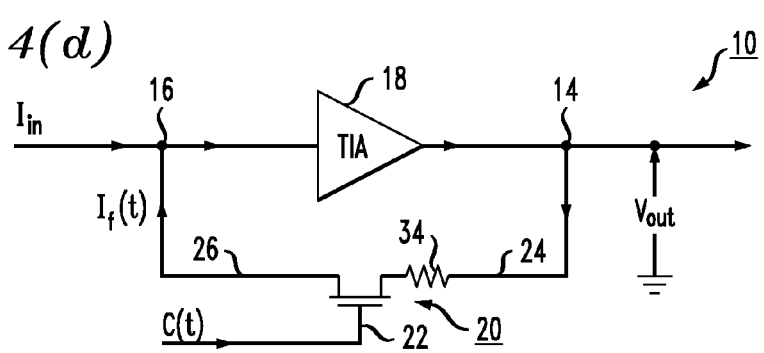

In order to provide some additional control to the range of resistive values, the arrangement of FIG. 4(b) illustrates the addition of a shunt resistor 30 between source 26 and drain 24 of FET 20. The presence of resistor 30 limits the feedback resistance of variable feedback resistance element 12 so as to not exceed the specific value of shunt resistor 30, even when FET 20 is in cutoff mode. FIGS. 4(c) and 4(d) illustrate alternative embodiments where a resistor is added in series with FET 20. In particular, FIG. 4(c) illustrates an arrangement with a series resistance 32 added between source 26 of FET 20 and input node 16. FIG. 4(d) illustrates an arrangement with a series resistance 34 added between drain 24 of FET 20 and output node 14. The embodiments of FIGS. 4(c) and (d) provide limitations on the other end of the feedback resistance value of element 12, that is, providing a lower limit on how small the feedback resistance can become, even when FET 20 is in saturation.

FIG. 5 illustrates various types of waveforms that may be used as the bit-synchronous control signal input C(t) to variable feedback resistance element 12. The waveform shown in FIG. 5(a) may be generated from a voltage-controlled oscillator (VCO) that is locked to the bit rate, where the waveform of FIG. 5(b) may be created as a result of passing the signal of FIG. 5(a) through a low-pass filtering arrangement that will "round" the corners of the signal. The waveform of FIG. 5(c) is even more rounded than that of FIG. 5(b), essentially sinusoidal, and can be created through additional low-pass and/or narrowband filtering. Other variations, shown in FIGS. 5(d) and (e) may be used. In any embodiment, it is to be understood that the phase of control signal C(t) relative to the incoming signal $I_L$, is very important, and may need to be actively adjusted in some embodiments so that the adjustments in receiver bandwidth remain synchronized with the location along the width of an incoming bit (i.e., higher bandwidth at leading edge of bit, lower bandwidth in middle of bit).

Figure 6:
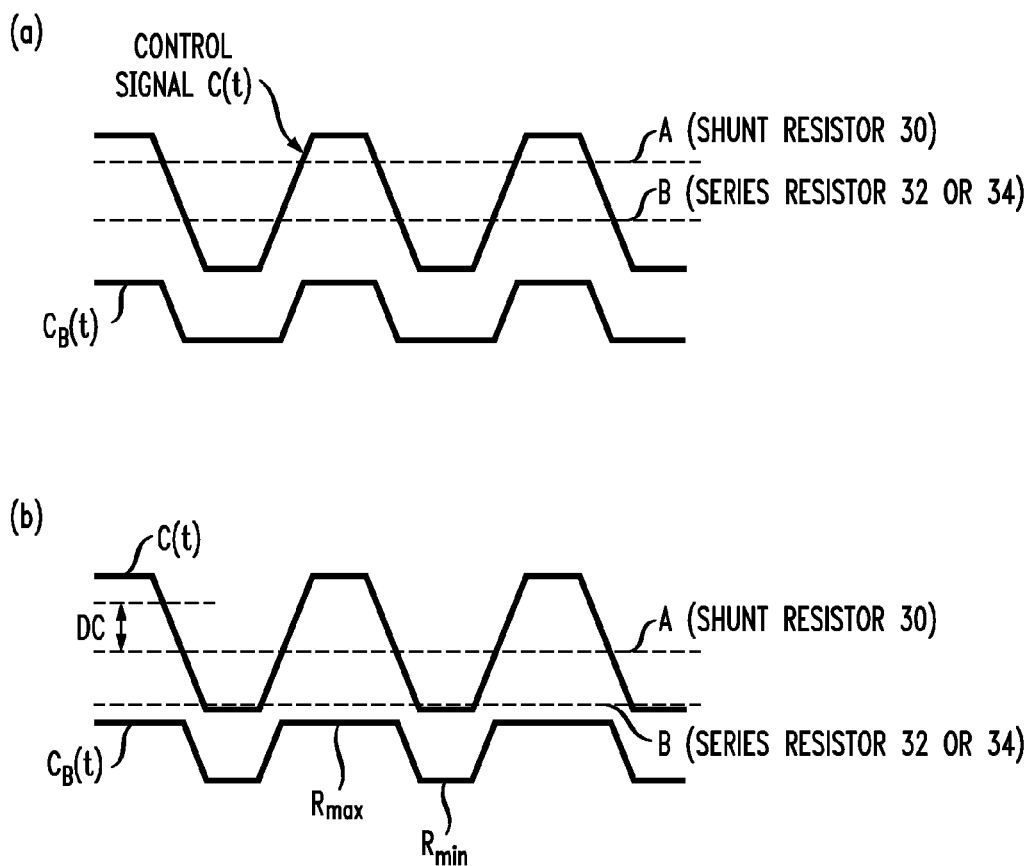
FIGS. 6(a) and (b) illustrate the effect of duty cycle, saturation and cutoff on control signal C(t)

In the preferred embodiment of the present invention, the duty cycle of control signal C(t) is not 50%. Indeed, it has been found that improved receiver sensitivity is obtained when variable feedback resistance element 12 is configured to exhibit a relatively "low" resistance at each bit transition and a "high" resistance otherwise (not only in the center in the bit). The plots as shown in FIG. 6 illustrate this aspect of the present invention.

FIG. 6(a) contains a plot of an exemplary waveform for a control signal C(t), where dotted line A illustrates the effective of shunt resistor 30 (as shown in FIG. 4(b)) on "clamping" the uppermost excursions of the waveform (saturation mode of FET 20). Dotted line B similarly represents the effect of series resistors 32 or 34 (FIG. 4(c) or (d)) on "clamping" the lower limit of waveform C(t), the cutoff mode of FET 20. When both types of impedance limitations are utilized, the resulting waveform takes the form of bounded control signal $C_B(t)$ as shown.

In the plot of FIG. 6(b), the initial incoming control signal C(t) is shown as being shifted upward in the positive direction by applying a predetermined DC bias voltage to control signal C(t). Saturation and cutoff levels A and B remain the same as for the arrangement of FIG. 6(a) and, as a result, the resulting maximum resistance portion $R_{max}$ of bounded waveform $C_B(t)$ extends over a longer portion of the bit duration, when compared to waveform $C_B(t)$ of FIG. 6(a). Similarly, the minimum resistance portion $R_{min}$ of waveform $C_B(t)$ is of shorter duration than that associated with waveform $C_B(t)$ of FIG. 6(a). Thus, it is shown that by varying the DC bias associated with the incoming bit-synchronous control signal, the duty cycle of the signal will vary as well, with this variation used to control the feedback resistance of TIA 18.

Figure 7:
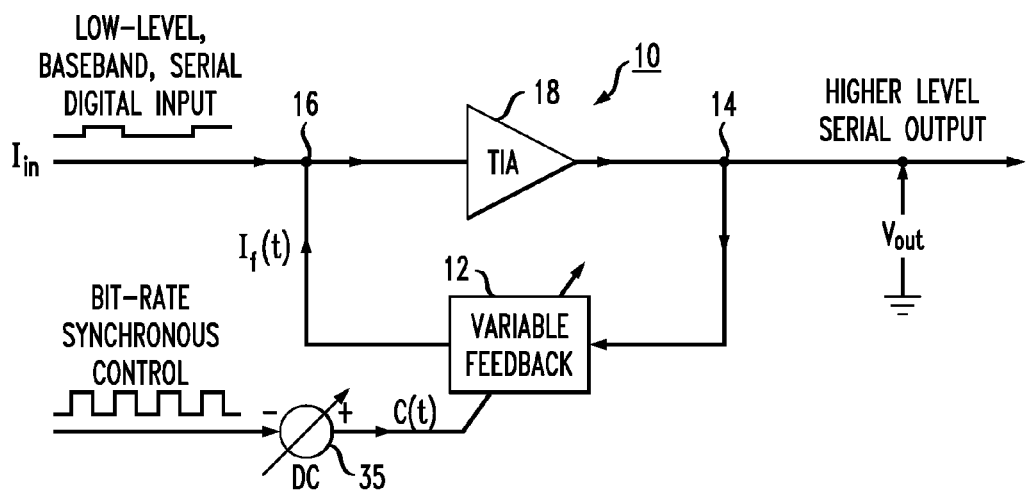
FIG. 7 shows an embodiment of the present invention including a DC bias source to control the duty cycle of control signal C(t)
Figure 8:
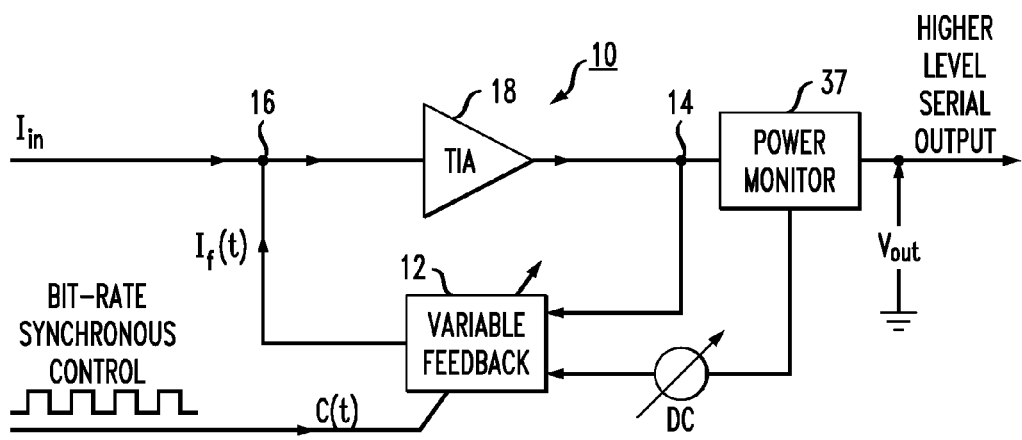
FIG. 8 shows yet another embodiment of the present invention, in this case incorporating an input level monitor to adjust and control the magnitude of control signal C(t) as a function of the level of the incoming digital signal.

FIG. 7 illustrates an embodiment of the present invention that includes a variable DC bias source 35 disposed along the signal path of control signal C(t). It is also be to noted that as the input signal level increases away from the sensitivity point, the need for the bit synchronous control signal decreases. Thus, it is considered reasonable to decrease the magnitude of control signal C(t) with increasing input power, and/or shift the DC bias level accordingly. FIG. 8 illustrates another embodiment of the present invention, incorporating a power monitor 37 that is used to look for a predetermined power threshold and function to decrease the magnitude of control signal C(t) when this threshold is crossed.

Figure 9:
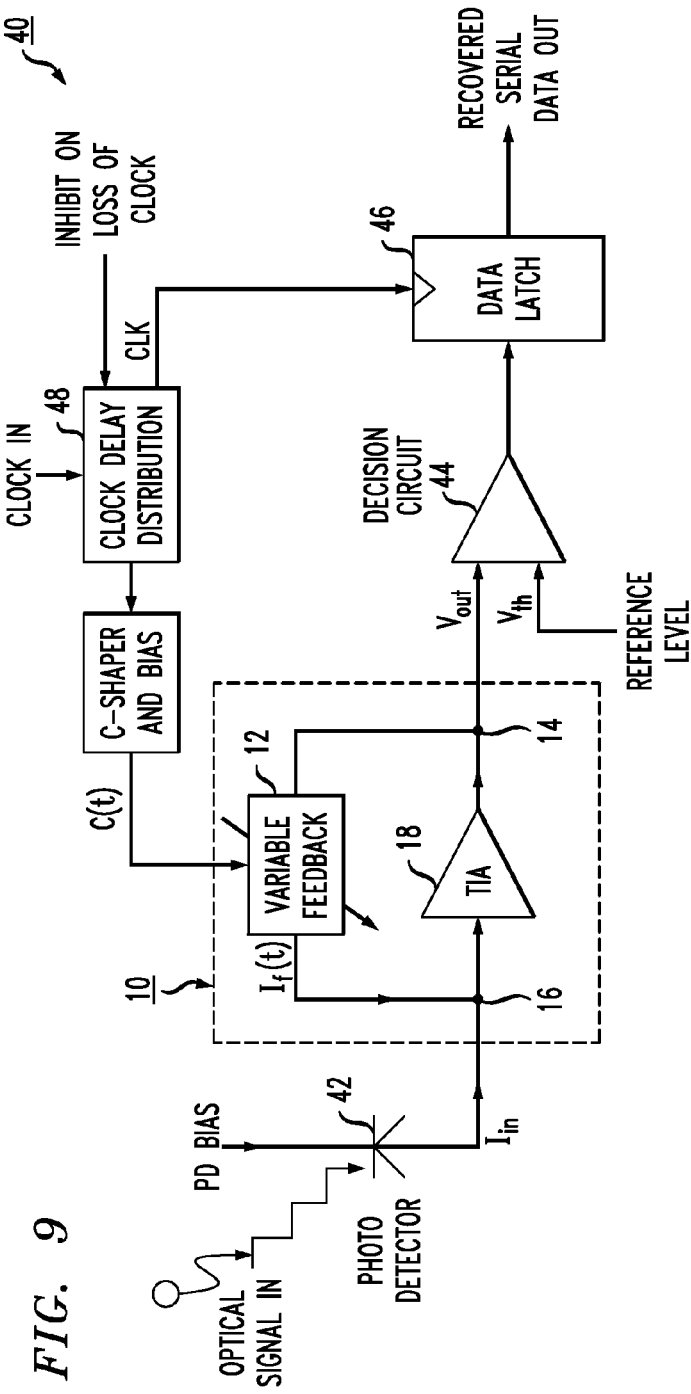
FIG. 9 illustrates an exemplary optical receiver incorporating the bit-synchronous feedback control of receiver sensitivity of the present invention.

FIG. 9 illustrates an exemplary optical receiver 40 incorporating the bit-synchronous feedback control of receiver sensitivity of the present invention as described above. As shown, an incoming optical signal O is passed through a photodiode 42 to create a low-level (weak) electrical current output signal, defined above as $I_{in}$. As described above, signal $I_{in}$ is applied as an input to, and amplified by, amplifying circuit 10, which provides amplified output voltage $V_{out}$. Amplified output voltage $V_{out}$ is thereafter applied as a first input to a decision circuit 44. A second input to decision circuit 44 is a threshold voltage, $V_{th}$, where the determination of whether a digital "zero" or "one" has been received is based upon a comparison of $V_{out}$ to $V_{th}$. The stream of digital output signals (of one's and zero's) from decision circuit 44 is then applied as the signal input to a data latch 46, which creates a properly "clocked" stream of output pulses by controlling data latch 46 with a clock signal, denoted CLK in FIG. 9.

As also shown in FIG. 9, a clock delay distribution circuit 48 is utilized to provide bit-synchronized control signals to both variable feedback resistive element 12 (used as control signal C(t) in the manner described above) and data latch 46. The delay associated with circuit 48 is controlled to align the time-variable feedback applied to element 12 during the most opportune time for the incoming data signal, as well as to generate the different delay required to properly "clock" the output from decision circuit 44 to most accurately recreate the transmitted data signal with a minimal BER.

In situations where no local clock exists and bit-synchronous control signal C(t) must be derived from a local clock recovery device, the output of clock delay and distribution circuit 48 is gated "on" or "off" by the state of clock recovery lock detect circuits (not shown). In the event that the clock recovery is not able to lock onto a clock, then control signal C(t) is turned "off". When the clock recovery circuit asserts a successful lock, then clock delay and distribution circuit 48 is gated "on" and bit-synchronous control signal C(t) is applied to variable resistive feedback element 12.

Figure 10:
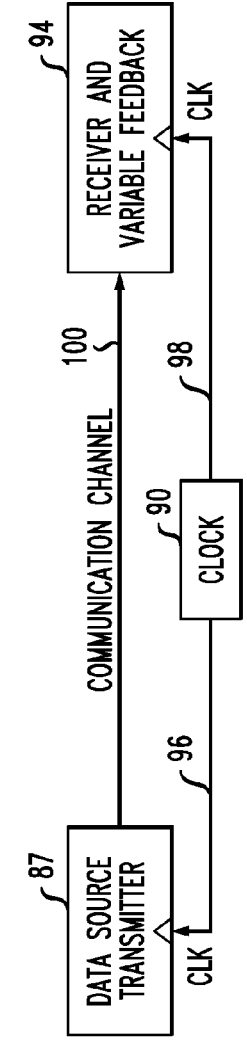
FIG. 10 depicts a different synchronization method that may be used in accordance with the present invention.

FIG. 10 depicts a different synchronization method that may be used in accordance with the present invention and that does not require a "loss of clock" inhibit gate circuit. In this case, a master clock 90 is utilized, where master clock 90 may be disposed at any location with respect to a data source 92 and a receiver 94, where an exemplary receiver 94 includes the bit-synchronous feedback arrangement of the present invention (not shown) for controlling receiver sensitivity. Master clock 90 is shown as applied to clock the incoming data from data source 92 along a first signal path 96, and similarly propagates along a signal path 98 to be applied as a clocking input to receiver 94. Because the relative delays in the transmission of the clock over signal paths 96 and 98, as well as the range of possible delays introduced by a communication channel 100, it is recommended that there be a provision to vary the delay of the received clock (over a range of, for example, at least one bit interval) in order to maximize performance. For example, a microcontroller that controls an electronic delay circuit can be used.

As will be apparent to those skilled in the art, numerous modifications may be made within the scope of the invention, which is not intended to be limited except in accordance with the following claims.

What is claimed is:

1. A receiver including an amplifying section for converting a relatively low power digital input signal into a relatively high power digital output signal, the receiver including
    an adjustable feedback element disposed between the output and the input of the amplifying section of the receiver, the adjustable feedback element responsive to a control signal input C(t) that is synchronous with the lower power digital data input signal (bit-synchronous) for generating a bit-synchronous adjustable feedback signal where the level of the feedback signal changes as a function of time along the width of each bit of the digital input signal, providing an increased bandwidth of the receiver at the leading edge of each incoming bit and a decreased bandwidth along the remainder of the duration of each incoming bit.

2. A receiver as defined in claim 1 wherein the adjustable feedback element is an adjustable resistive feedback element.

3. A receiver as defined in claim 2 wherein the adjustable resistive feedback element comprises a field effect transistor (FET) including a gate terminal, a drain terminal and a source terminal, with the drain terminal coupled to the output of the amplifying section, the source terminal coupled to the input of the amplifying section and the gate terminal coupled to receive the control signal C(t) that is bit synchronous with the digital input signal.

4. A receiver as defined in claim 2 wherein the adjustable resistance feedback element further comprises a shunt resistor coupled between the source and drain terminals of the FET to limit the excursion of the adjustable resistance feedback element when the FET is in cut-off mode.

5. A receiver as defined in claim 4 wherein the shunt resistor is a variable resistor.

6. A receiver as defined in claim 2 wherein the adjustable resistance feedback element further comprises a series resistor coupled between the drain terminal of the FET and the output of the amplifying section, the series resistor for limiting the excursion of the adjustable resistance feedback element when the FET is in saturation mode.

7. A receiver as defined in claim 6 wherein the series resistor is a variable resistor.

8. A receiver as defined in claim 2 wherein the adjustable resistance feedback element further comprises a series resistor coupled between the source terminal of the FET and the input of the amplifying section, the series resistor for modifying the excursion of the adjustable resistance feedback element when the FET is in cutoff mode.

9. A receiver as defined in claim 8 wherein the series resistor is a variable resistor.

10. A receiver as defined in claim 1 wherein control signal C(t) is configured to exhibit a duty cycle other than 50%.

11. A receiver as defined in claim 10 wherein the receiver further comprises a DC bias source disposed along the control signal C(t) input to the gate terminal of the FET, the DC signal used to modify the duty cycle of control signal C(t).

12. A receiver as defined in claim 1 wherein control signal C(t) comprises an adjustable duty cycle.

13. A receiver as defined in claim 12 wherein the receiver further comprises a variable DC bias source disposed along the control signal C(t) input to the gate terminal of the FET, the level of the DC signal being varied to modify the duty cycle of control signal C(t).

14. A receiver as defined in claim 1 wherein the receiver further comprises an input power monitor for controlling the magnitude of the applied control signal C(t) as a function of the power level of the digital input signal.

15. A receiver as defined in claim 1 wherein the adjustable feedback element comprises an adjustable gain feedback element.

* * * * *